(12) United States Patent
Ramappa et al.

(10) Patent No.: US 7,268,073 B2
(45) Date of Patent: Sep. 11, 2007

(54) POST-POLISH TREATMENT FOR INHIBITING COPPER CORROSION

(75) Inventors: Deepak A. Ramappa, Dallas, TX (US); Mona Eissa, Allen, TX (US); Christopher Lyle Borst, Plano, TX (US); Ting Y. Tsui, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/985,193

(22) Filed: Nov. 10, 2004

(65) Prior Publication Data
US 2006/0099804 A1 May 11, 2006

(51) Int. Cl.
*H01L 21/44* (2006.01)

(52) U.S. Cl. ......... 438/652; 257/E21.17; 257/E21.47; 438/682

(58) Field of Classification Search ......... 438/652, 438/680, 682; 257/E21.17, E21.477; 427/255.27
See application file for complete search history.

(56) References Cited

U.S. PATENT DOCUMENTS

| 5,447,887 | A * | 9/1995 | Filipiak et al. ......... 438/644 |
|---|---|---|---|
| 6,211,084 | B1 | 4/2001 | Ngo et al. |
| 6,303,505 | B1 | 10/2001 | Ngo et al. |
| 6,339,025 | B1 | 1/2002 | Liu et al. |
| 6,492,266 | B1 | 12/2002 | Ngo et al. |
| 6,660,634 | B1 | 12/2003 | Ngo et al. |
| 6,777,811 | B2 | 8/2004 | Harada |
| 6,787,480 | B2 | 9/2004 | Aoki et al. |
| 6,790,769 | B2 * | 9/2004 | Kurashima et al. ......... 438/633 |
| 6,806,191 | B2 * | 10/2004 | Zistl et al. ............ 438/687 |
| 2003/0194877 | A1 * | 10/2003 | Yau et al. ............ 438/745 |
| 2004/0097075 | A1 | 5/2004 | Bradshaw et al. |
| 2005/0014360 | A1 * | 1/2005 | Yu et al. ............ 438/622 |
| 2005/0196954 | A1 * | 9/2005 | Noguchi ............ 438/622 |

OTHER PUBLICATIONS

"Passivation of Copper by Silicide Formation in Dilute Silane", S. Hymes, S.P. Murarka, C. Shepard and W.A. Lanford, Journal of Applied Physics, vol. 71(9), May 1, 1992, 4623-4625.

* cited by examiner

*Primary Examiner*—Caridad Everhart
(74) *Attorney, Agent, or Firm*—Peter K. McLarty; W. James Brady, III; Frederick J. Telecky, Jr.

(57) ABSTRACT

Methods (102) are presented for protecting copper structures (26) from corrosion in the fabrication of semiconductor devices (2), wherein a thin semiconductor or copper-semiconductor alloy corrosion protection layer (30) is formed on an exposed surface (26a) of a copper structure (26) prior to performance of metrology operations (206), so as to inhibit corrosion of the copper structure (26). All or a portion of the corrosion protection layer (30) is then removed (214) in forming an opening in an overlying dielectric (44) in a subsequent interconnect layer.

8 Claims, 6 Drawing Sheets

POST-POLISH TREATMENT FOR INHIBITING COPPER CORROSION

FIELD OF INVENTION

The present invention relates generally to semiconductor devices and more particularly to methods for treating copper structures to prevent or inhibit corrosion in the fabrication of semiconductor devices.

BACKGROUND OF THE INVENTION

In the manufacture of semiconductor products such as integrated circuits, individual electrical components are formed on or in a semiconductor substrate, and are thereafter interconnected to form electrical circuits. Interconnection of these components within a semiconductor device is typically accomplished by forming a multi-level interconnect network structure in layers formed over the electrical components, sometimes referred to as metalization, by which the device active elements are connected to other devices to create the desired circuits. Individual wiring layers within the multi-level network are formed by depositing an insulating or dielectric layer over the discrete devices or over a previous interconnect layer, and patterning and etching openings for vias and/or trenches. Conductive material, such as copper or tungsten is then formed in the openings to form inter-layer contacts and interconnect routing structures.

In forming a single metalization level or layer, a dielectric material is typically deposited over a previous metalization level, and the dielectric is selectively etched to form openings at predefined locations that extend through the dielectric to the underlying metalization level. Copper is then deposited, which fills the openings and covers the entire dielectric of the current level. After copper deposition, the wafer is planarized using chemical mechanical polishing (CMP) to expose portions of the dielectric between the copper-filled openings. At this point in the process, it is desirable to inspect the wafer to ascertain the quality and integrity of the interconnect structures, using measurement equipment and techniques referred to as metrology operations. For instance, it is desirable to measure trench widths and copper feature resistivity, and to perform other defect analysis and electrical parameter tests, in order to separate out defective wafers and avoid the cost of further processing those wafers that will not meet final product quality standards. Often, such metrology takes 8-12 hours, wherein reducing the amount of metrology after CMP risks missing an early detection of defects in the metalization structures.

However, the planarization exposes the upper surfaces of the copper-filled trenches and vias to moisture and other corrosive ambient conditions, particularly where the planarized wafers are transferred from instrument to instrument to perform the desired metrology operations. Such corrosive ambient conditions cause oxidation and other degradation of the copper, leading to increased contact resistance and adhesion problems in subsequent fabrication processing. Corrosion of copper interconnect structures is detrimental to interconnect isolation integrity, and can lead to interconnect leakage between copper structures in a single metalization level, as well as premature dielectric breakdown (e.g., reduced breakdown voltage withstanding capacity). In this regard, conductive metal diffusion barriers are typically formed in the dielectric trench or via openings to prevent out-diffusion of the subsequently deposited copper. After planarization, oxidation occurs rapidly at the junction of the dissimilar metals (the copper and the barrier metal) along the edges of the exposed conductive interconnect structure. The corrosion tends to migrate outward from the edges of the structure, thereby reducing the isolation distance between adjacent conductive features, by which the likelihood of detrimental intra-level dielectric breakdown is increased.

Efforts have been made to alleviate the copper corrosion by coating the polished wafer with an organic benzotriazole (BTA) layer prior to performing metrology operations. However, BTA coatings tend to evaporate and the corrosion protection typically only lasts for 3-6 hours. This process time window for making measurements of the planarized wafer is insufficient to allow the full range of metrology operations desired to effectively sort out defective wafers, where a longer process window of up to 12 hours or more is desirable. Also, the use of BTA requires a separate cleaning step after the metrology to remove any remaining BTA. Another approach involves depositing an etch-stop layer material over the planarized wafer prior to metrology. However, many metrology operations employ non-contacting measurement instruments, such as laser based physical defect detection tools, secondary electron microscopes, resistivity measuring laser tools and the like which do not cause physical harm to the wafer, but whose measurement capabilities are best utilized when the measured features and structures are conductive. While the exposed copper surfaces on the wafer are conductive, the etch-stop materials are typically non-conductive (e.g., silicon nitride or silicon carbide). Thus, while forming the etch-stop layer prior to metrology may inhibit unwanted copper corrosion, this approach inhibits the ability to obtain proper metrology measurements. Accordingly, there remains a need for improved techniques for protecting copper structures from corrosion while facilitating in-line metrology measurements in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. The primary purpose of the summary is to present some concepts of the invention in a simplified form as a prelude to the more detailed description that is presented later. The invention relates to methods for treating copper structures to prevent or inhibit corrosion during fabrication processing of semiconductor devices, which may be advantageously employed to widen the process window for metrology operations following planarization steps in forming back-end metalization structures.

One aspect of the invention provides a method of protecting copper structures from corrosion in the fabrication of semiconductor devices. The method comprises providing a copper structure with an exposed first surface in a semiconductor device, forming a semiconductor or semiconductor-copper alloy corrosion protection layer on the exposed first surface of the copper structure, performing a metrology operation after forming the corrosion protection layer, and forming an etch-stop layer, such as silicon carbide or silicon nitride, over the corrosion protection layer after performing the metrology operation. The provision of the corrosion protection layer facilitates sometimes lengthy metrology operations in which the device wafer may be subjected to humidity or other corrosive environments, where the semiconductor or semiconductor-copper alloy provides a generally conductive surface over the exposed first surface of the copper structures that facilitates inspection and measurement of various features or qualitative aspects of the device while protecting the upper copper surfaces from corrosion.

In one implementation, the corrosion protection layer is formed by exposing the first surface of the copper structure to a plasma-free silane gas treatment at a relatively low temperature for a short time so as to form a thin protection bilayer comprising a copper silicide formed on the first surface of the copper structure and silicon formed on the copper silicide, where full silicidation is not necessary. The method may further comprise removal of all or a portion of the corrosion protection layer following etch-stop layer formation, for example, when forming a contact to the conductive structure in creating a subsequent interconnect layer or level. In one example, a dielectric is formed over the etch-stop layer, and an opening is formed by selectively removing portions of the dielectric, the etch-stop layer, and the corrosion protection layer to expose at least a portion of the first surface of the copper structure, after which a conductive structure is formed in the opening.

Another aspect of the invention provides a method of protecting copper structures from corrosion in the fabrication of semiconductor devices, comprising providing a copper structure with an exposed first surface in a semiconductor device, forming a corrosion protection layer comprising a semiconductor or a semiconductor-copper alloy on the exposed first surface of the copper structure, forming an etch-stop layer over the corrosion protection layer, forming a dielectric over the etch-stop layer, forming an opening by selectively removing portions of the dielectric, the etch-stop layer, and the corrosion protection layer to expose at least a portion of the first surface of the copper structure, and forming a conductive structure in the opening.

Yet another aspect of the invention provides a method of protecting copper structures from corrosion in the fabrication of semiconductor devices. The method comprises providing a copper structure with an exposed first surface in a semiconductor device, exposing the first surface of the copper structure to a plasma-free silane gas treatment for a short time, such as about 40 seconds or less, to form a corrosion protection layer, for example, a semiconductor or a semiconductor-copper alloy, on the exposed first surface of the copper structure, and forming an etch-stop layer over the corrosion protection layer. The method may further comprise performing a metrology operation after the plasma-free silane gas treatment and before forming the etch-stop layer.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
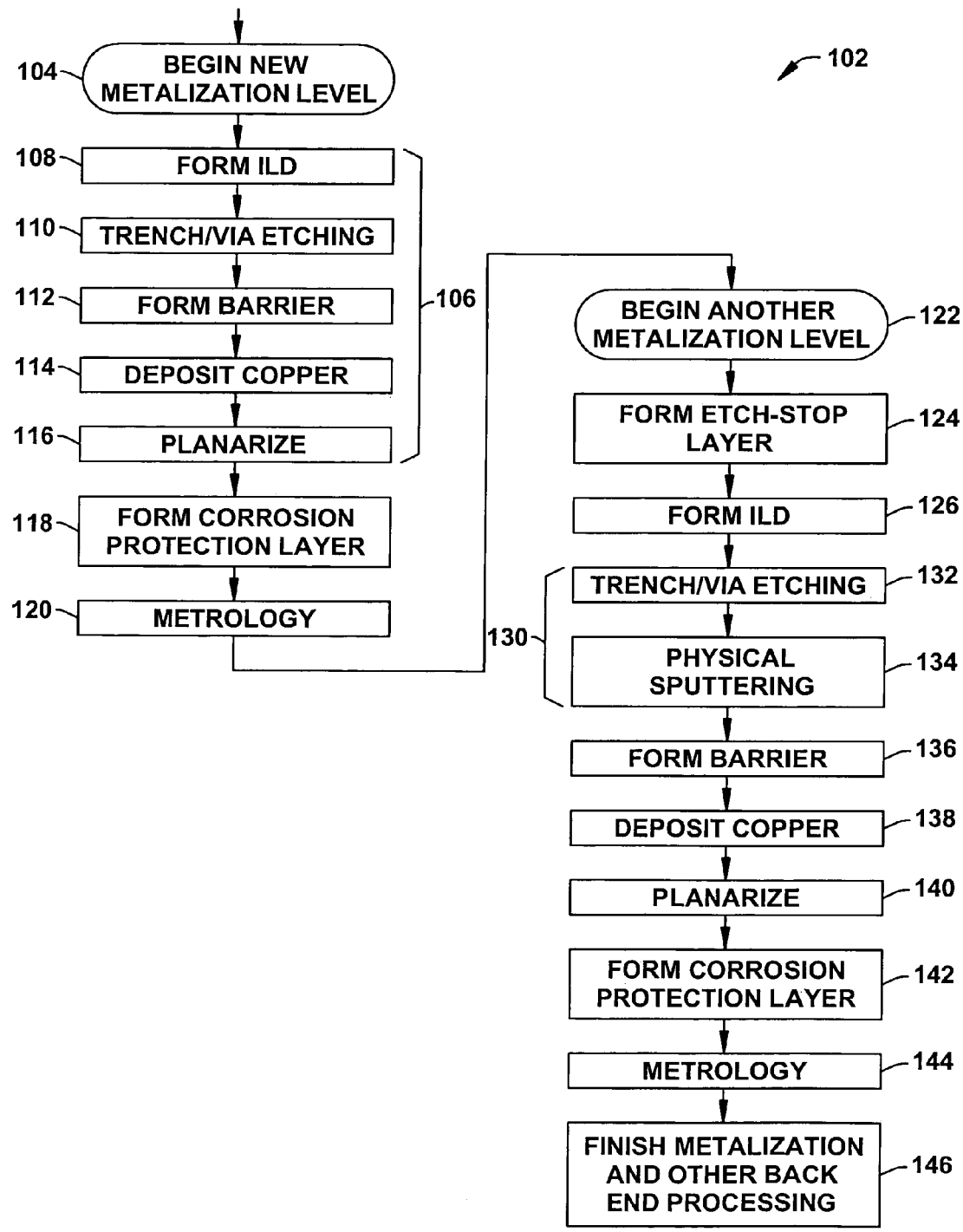
FIG. 1 is a flow diagram illustrating an exemplary semiconductor device metal interconnect system fabrication process flow in which one or more aspects of the invention are implemented.

The present invention will now be described with reference to the attached drawings, in which like reference numerals are used to refer to like elements throughout, wherein the illustrated structures are not necessarily drawn to scale. The invention relates to semiconductor device interconnect system fabrication processing and methods for protecting copper against corrosion, which may be employed at any point in a fabrication process flow. The invention is hereinafter illustrated and described in the construction of damascene type metalization interconnect structures, wherein protection is provided to prevent corrosion of copper surfaces exposed after planarization. However, the invention is not limited to the exemplary implementations illustrated and described hereinafter. In particular, the various aspects of the invention may be employed in association with processing of any type of copper structures, and may be used for protecting any surface or surfaces thereof from corrosion.

Figure 2A:
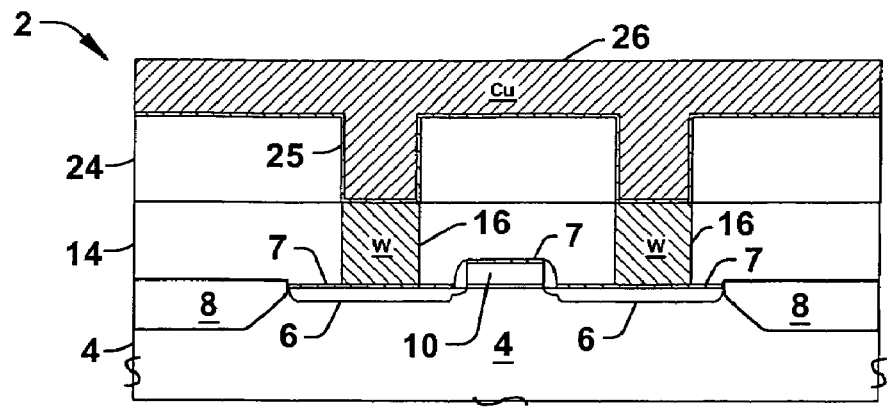
FIGS. 2A-2N are partial side elevation views in section illustrating an exemplary semiconductor device undergoing processing steps at various points during fabrication in accordance with the invention.
Figure 2B:
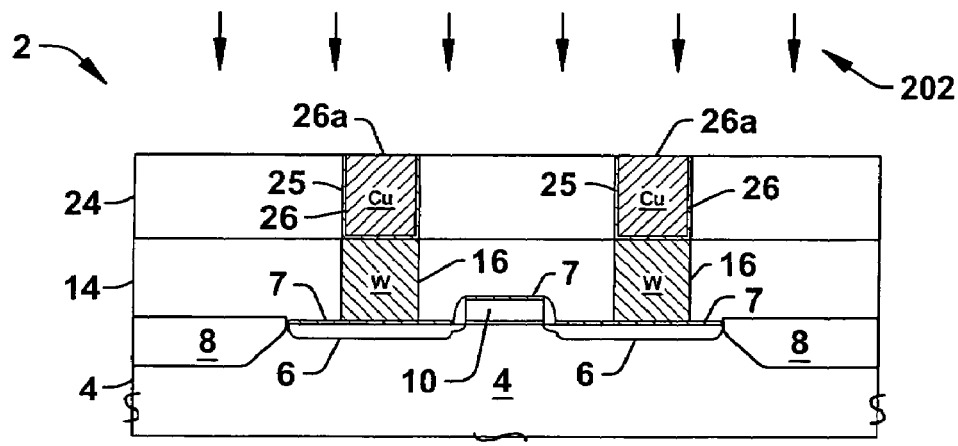
Figure 2C:
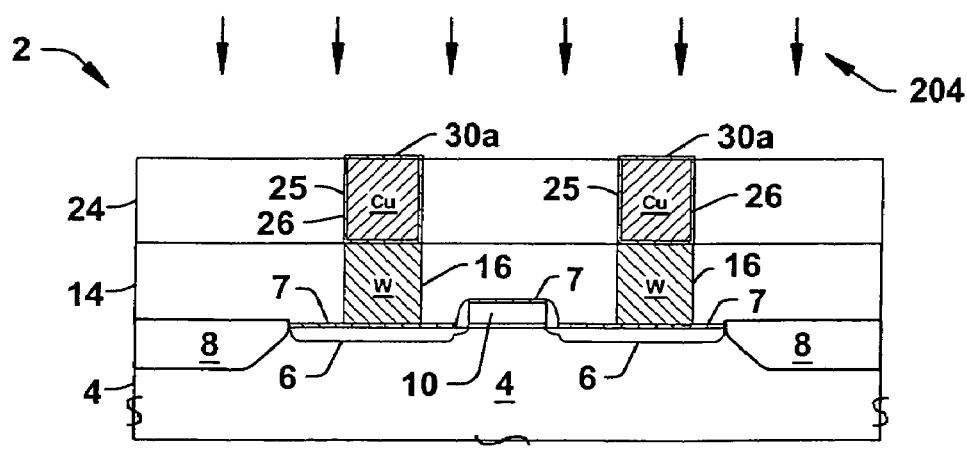
Figure 2D:
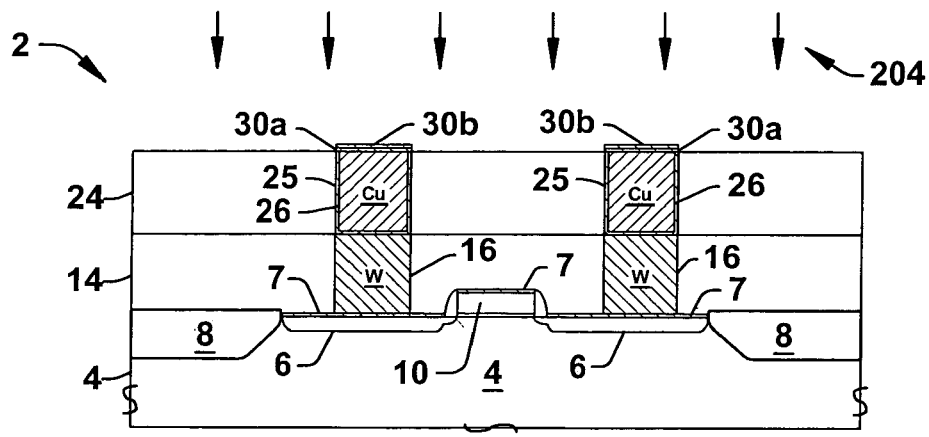
Figure 2E:
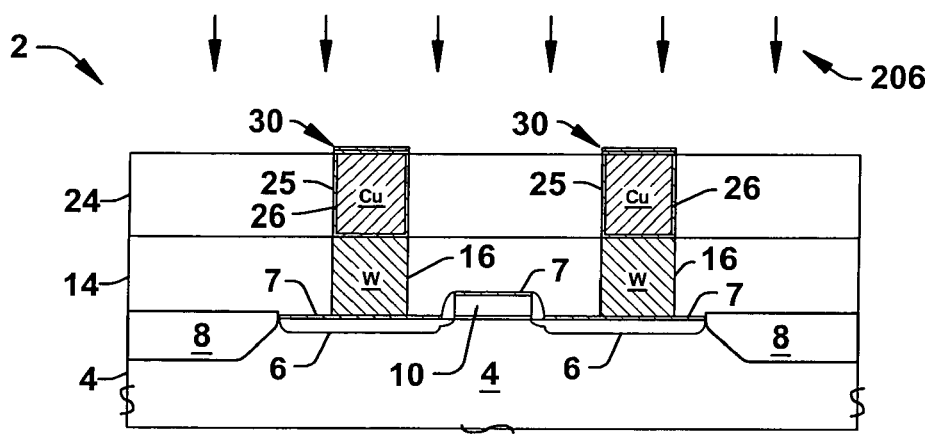
Figure 2F:
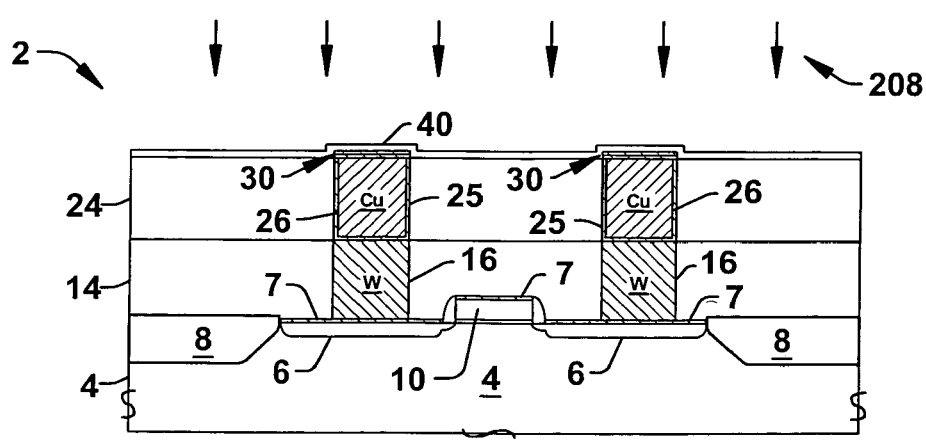
Figure 2G:
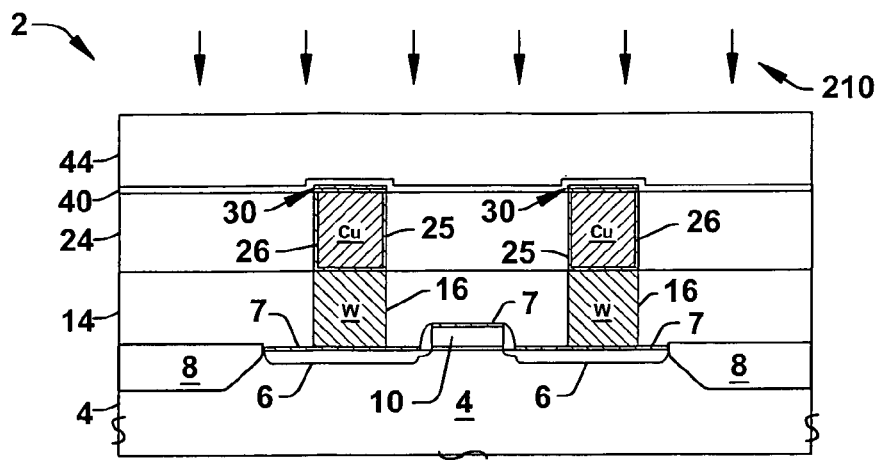
Figure 2H:
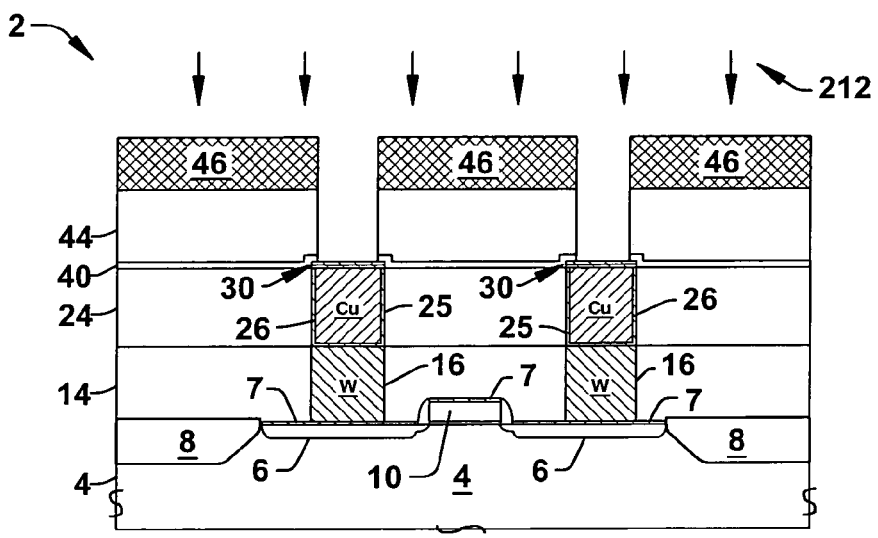
Figure 2I:
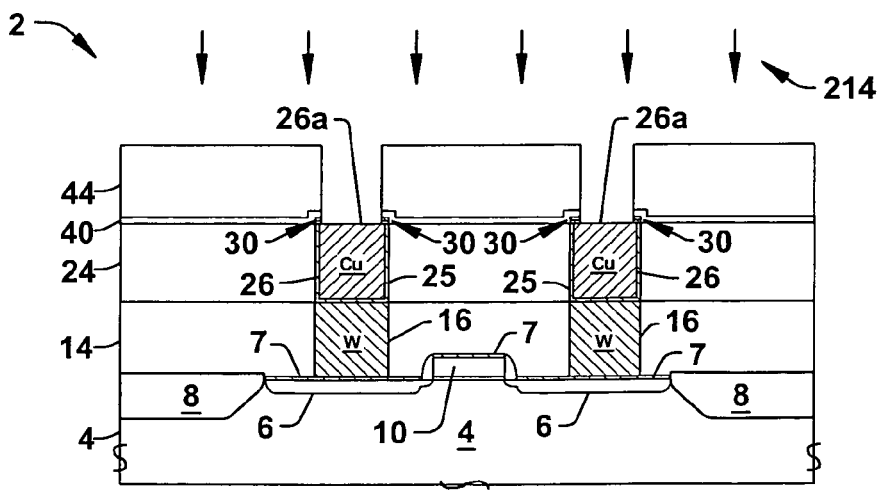
Figure 2J:
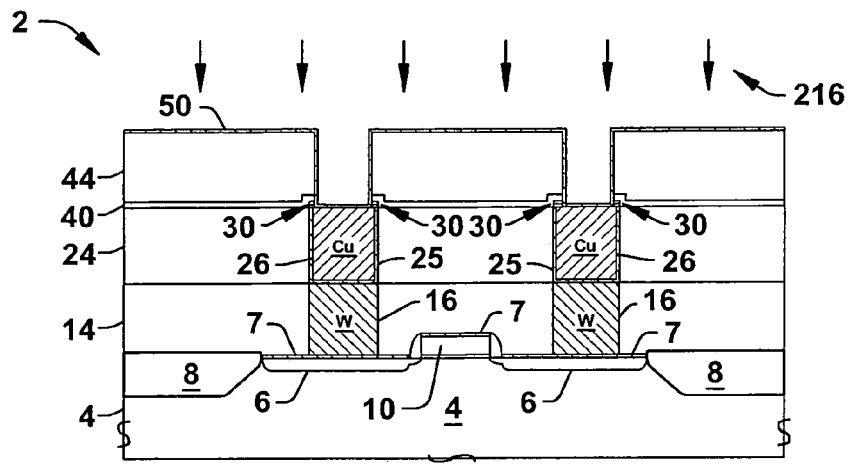
Figure 2K:
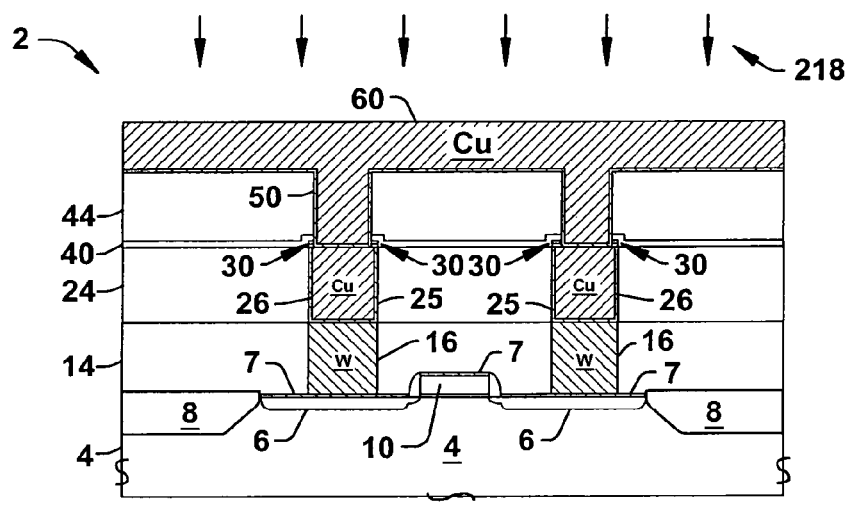
Figure 2L:
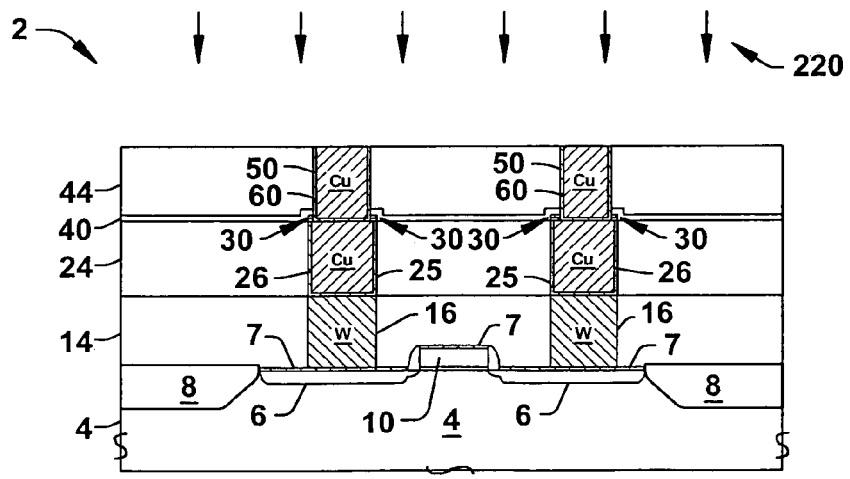
Figure 2M:
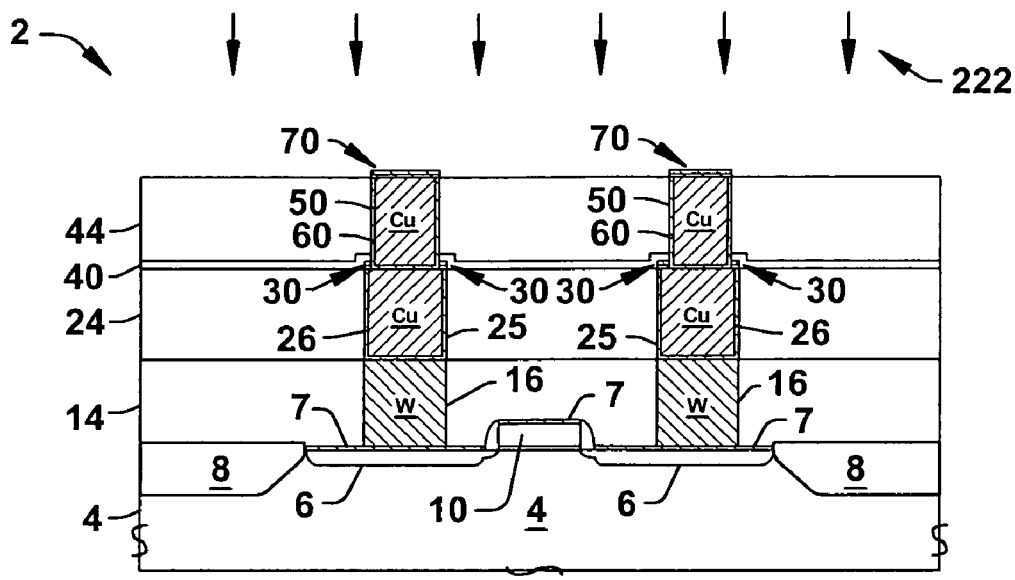
Figure 2N:
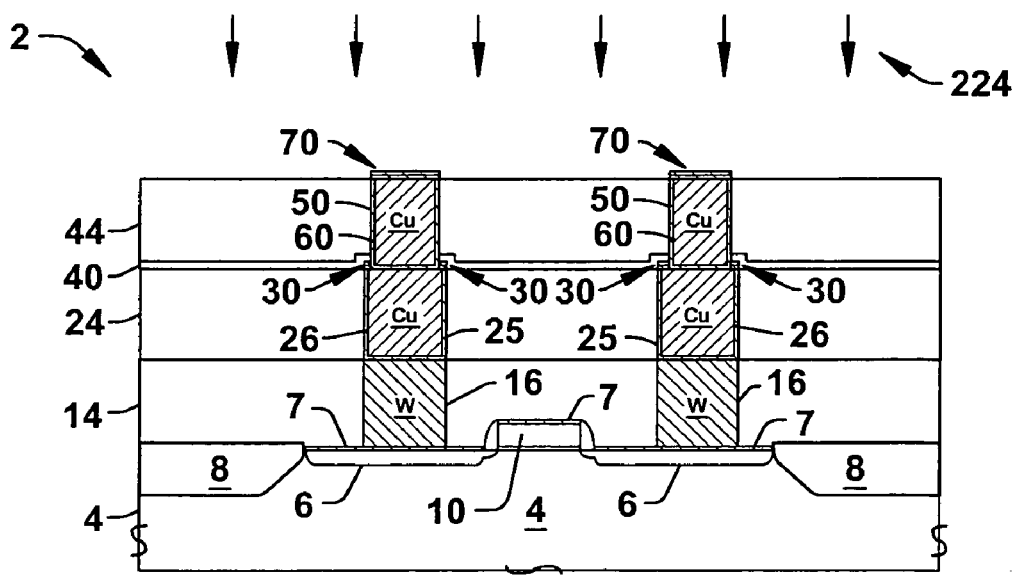

FIG. 1 illustrates a portion of an exemplary semiconductor device fabrication process flow including a method 102 for protecting copper structures from corrosion in constructing a multi-level interconnect (e.g., metalization) structure, and FIGS. 2A-2N illustrate an exemplary semiconductor device 2 undergoing fabrication processing generally in accordance with the method 102. While the exemplary method 102 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

As illustrated in FIG. 2A, the device 2 initially undergoes front-end processing, such as creation of n and p-wells in a semiconductor body (e.g., a silicon wafer) 4, and formation of isolation structures (e.g., shallow trench isolation (STI) structures 8 in FIG. 2A or field oxide structures formed using local oxidation of silicon (LOCOS) techniques). Transistors are formed for logic or analog circuitry, and silicide structures 7 are formed at the transistor terminals (e.g., source/drains and gate), wherein the illustrated transistor comprises a gate dielectric situated between a channel region of the semiconductor body 4 and an overlying gate electrode 10, as well as source/drains 6 formed in the semiconductor body 4 on either side of the channel.

An initial dielectric material 14 is formed over the transistors, referred to herein as a pre-metal dielectric (PMD), and conductive contacts 16 (e.g., tungsten, polysilicon, or other conductive material) are formed through the PMD layer 14 for connection to the silicide 7 at the cell transistor source/drains 6. Any suitable dielectric material 14 of any desired thickness can be employed in forming the initial PMD layer 14 and other dielectrics described herein. In one possible implementation, a selective etch process (reactive ion etching or other suitable etch process with appropriate etch mask, not shown) is used to selectively etch portions of the PMD material 14, thereby creating openings into which tungsten (W) or other conductive material 16 is provided to create the conductive contacts 16.

A first metalization layer or level is then constructed over the PMD 14 and the contacts 16, beginning at 104 in the method 102 of FIG. 1, wherein a copper structure is provided in the device 2 generally at 106. An inter-level or inter-layer dielectric (e.g., ILD0) is deposited at 108 (layer 24 in FIG. 2A) over the PMD layer 14 and the contacts 16 thereof, and the ILD 24 is then selectively etched at 110 to form via and/or trench openings for electrical coupling to the tungsten contacts 16 in the PMD layer 14. A diffusion barrier layer 25 is formed at 112 within the etched openings and over the ILD material 24, to guard against diffusion of subsequently formed copper into the ILD material 24. Examples of suitable barrier materials include conductive compounds of transition metals such as tantalum nitride, titanium nitride, and tungsten nitride as well as the various transition metals themselves. At 114, a seed copper layer is deposited over the diffusion barrier 25, to facilitate subsequent copper filling of the via cavity, and an electrochemical deposition (ECD) process is then performed at 114 to deposit a copper layer 26 (Cu) over the wafer, which fills the etched openings and overlies the barrier layer 25 on top of the remaining ILD dielectric 24, as shown in FIG. 2A.

Referring also to FIG. 2B, a chemical mechanical polishing (CMP) process 202 is performed to planarize the upper surface of the device at 116, which ideally stops on the ILD dielectric layer 24 and may slightly reduce the diffusion barrier 25 and the deposited copper 26, thereby defining two separate copper structures 26 with exposed first (upper) surfaces 26a.

In accordance with the present invention, a corrosion protection layer 30 is then formed at 118 on the exposed surfaces 26a, as illustrated in FIGS. 2C and 2D, where the protection layer 30 comprises a semiconductor or an alloy of a semiconductor and copper. In the exemplary device 2, the corrosion protection layer 30 comprises silicon and/or copper silicide, where a bilayer structure 30 is formed including a copper silicide 30a formed on the first surface 26 of the copper structure 26 (FIG. 2C), and silicon 30b formed on the copper silicide 30a (FIG. 2D), wherein the amount of silicidation, if any, of the semiconductor material 30b is not critical to the invention. Any suitable process may be employed to form the protection layer 30 within the scope of the invention, where the exemplary implementation employs a silane treatment process 204. The exemplary silane process 204 involves exposing the device 2 to a low temperature plasma-free ambient of 2% silane/nitrogen mixture for a short time, such as about 40 seconds or less, preferably about 2-30 seconds, more preferably about 2-10 seconds. In one example, silane gas (e.g., $SiH_4$) is provided at a flow rate of about 200-300 sccm and nitrogen gas (e.g., $N_2$) is provided at about 9000 sccm at a temperature of about 350 degrees C. or less, such as about 300-350 degrees C., at a pressure of about 4 Torr for about 2-10 seconds to form a thin corrosion protection layer 30 having a thickness of about 50 angstroms or less, preferably about 10-50 angstroms.

The low-temperatures and short duration of the process 204 advantageously provide for a thin conductive protection layer 30 without exceeding back-end thermal budgets for the device 2, wherein the layer 30 protects the upper first copper surface 26a from corrosion while facilitating non-contact and/or contact metrology operations. Moreover, the protection layers 30 of the invention provide such corrosion protection for as long as needed to perform full metrology inspections, without evaporating or degrading, as was the case with BTA coatings in the past. Furthermore, the protection layer 30 is conductive, whereby metrology measurements are facilitated using non-contacting type measurement instruments, and the thin layer 30 can be easily removed when forming a subsequent metalization level, as described further below. In this regard, any suitable semiconductor material and/or copper-semiconductor materials may be used in forming the corrosion barrier layer 30 in accordance with the invention, which may be a single or multi-layer structure. For instance, the process 204 may employ other gases that operate to form silicon or other semiconductor, such as those used in epitaxial silicon processes, or gases that form other semiconductors (e.g., silicon Si, germanium Ge, etc.) to form semiconductors and/or copper-semiconductor alloys (e.g., copper silicide $Cu_3Si$ or other phase of copper-silicon alloy, copper germanide $Cu_3Ge$ or other phase of copper-germanium alloy, etc.).

Referring also to FIG. 2E, following the formation of the corrosion protection layer 30 at 118, one or more metrology operations 206 are then performed at 120. Any metrology operation(s) 206 may be performed after forming the corrosion barrier 30 and before formation of an etch-stop layer within the scope of the invention. For example, the operations 206 may include measurement of trench or via widths, defect analysis, resistivity analysis (indicates volume of copper 26), analysis of block defects in the copper 26, electrical parameter tests, etc. Unlike the case of the previously used BTA films, the metrology at 120 in the current invention can be of any duration, since the exemplary protection layer 30 does not evaporate or degrade significantly with time. Thus, metrology operations 206 lasting 12 hours or more can be undertaken without excessive copper corrosion. Moreover, since the layer 30 is conductive and the metrology operations 206 are performed at 120 before formation of an overlying etch-stop layer (e.g., prior to step 124 below), the metrology at 120 results are of higher value and reliability than those obtained following non-conductive etch-stop layers such as silicon nitride or silicon carbide. An ammonia or other forming gas treatment may optionally be performed after the metrology operations at 120 or following the silane treatment at 118, in order to passivate interface states on the upper surface of the polished dielectric material 24, and to address dangling bonds resulting from the CMP polishing operation.

Referring also to FIG. 2F, fabrication of another metalization level then begins at 122, wherein an etch-stop layer 40 is formed at 124 over the protection layer 30 and the upper surface of the ILD dielectric 24 using a deposition process 208. Any appropriate etch-stop materials 40 and layer fabrication process 208 may be employed at 124, such as depositing silicon carbide, silicon nitride, or other suitable etch-stop material 40 using chemical-vapor deposition (CVD) or other deposition techniques 208. Another ILD dielectric layer 44 is then formed at 126 over the etch-stop layer 40 using a deposition process 210, as shown in FIG. 2G.

Thereafter, an opening is formed at 130 by selectively removing portions of the dielectric 44, the etch-stop layer 40, and the corrosion protection layer 30 to expose at least a portion of the first surface 26a of the copper structure 26, as shown in FIGS. 2H and 2I. Any suitable material removal techniques may be employed at 130 within the scope of the invention. In the illustrated example, a patterned etch mask 46 is formed in FIG. 2H and a reactive ion etching (RIE) process 212 is employed at 132 to etch openings through the upper dielectric 44 and the etch-stop layer 40, wherein suitable etch chemistries may be used depending on the materials being etched. Referring also to FIG. 2I, following the trench/via etch at 132, a physical sputtering process 214 is performed at 134 to remove the exposed portion of the corrosion protection material 30 from the bottom of the trench/via openings, thereby exposing at least a portion of the upper first copper surfaces 26a.

It is noted that while the exemplary protection layer 30 is conductive, the removal of all or a portion of the layer 30 at 134 facilitates low resistivity contact of a subsequently formed conductive structure to the copper structure 26. In addition, since the exemplary protection layer 30 is relatively thin, the first surface 26a of the underlying copper structure 26 is easily exposed by the sputtering process 214 at 134 (e.g., an argon (Ar) sputter process, etc.). Furthermore, in the example of FIGS. 2H and 2I the etched openings are slightly narrower than the underlying copper structures 26, wherein small portions of the protection layer materials 30 may remain above the edges of the copper 26 and/or the barrier 25, wherein the removal process 214 may, but need not, remove all the protection layer material 30.

Conductive structures are then formed in the openings at 136-140, for example, using copper and diffusion barriers in a manner similar to that described above for the first interconnect metalization level. At 136, a conductive diffusion barrier layer 50 is formed in FIG. 2J via a deposition process 216, which serves to line the etched opening and extends over the exposed portions of the first surfaces 26a, where any suitable material, thickness, and deposition process 50 can be used in forming the diffusion barrier 50 at 136, such as those used in forming the first barrier 25 described above. The openings are then filled with copper 60 at 138 using a process 218 in FIG. 2K, for example, wherein a seed copper layer is first deposited over the diffusion barrier 50, followed by an ECD deposition process to fill the openings with copper 60 and to form copper 60 over the top surfaces of the barrier 50 above the ILD 44. Thereafter at 140, the wafer is planarized using a CMP process 220 to define copper conductive structures 60, as illustrated in FIG. 2L. As described above, another corrosion protection layer 70 is then formed at 142 over the exposed surfaces of the current copper structures 60 via a process 222, wherein the protection layer 70 and the process 222 may be the same as or similar to the initial protection layer 30 and the silane treatment process 204 described above. Another metrology operation 224 is then undertaken at 144, as illustrated in FIG. 2N, after which further metalization layers or levels may be constructed in similar fashion, and other back end processing is performed at 146 to complete the device 2.

The present invention provides for protection of exposed copper surfaces by which detailed metrology and inspections can be carried out prior to etch-stop layer formation, without the burden of the short process window afforded by BTA protection schemes. The protection layers of the invention may be provided at any point in a fabrication process flow at which an exposed copper surface may be subjected to corrosive ambient conditions, wherein the illustrated implementations in back-end metalization processing are merely exemplary. In metalization applications, moreover, the corrosion protection layers of the invention may be formed at each level of a multi-level interconnect structure, or only at certain levels. In this regard, the inventors have appreciated that the processing conditions used in forming the corrosion protection layers may be tailored for each interconnect level in accordance with a variety of factors. For instance, it has been found that the deposition (material formation) rate of the corrosion protection material during silane treatment is greater for wider copper structures than for narrower structures, wherein the processing time or duration can be adjusted according to the copper density and/or feature widths found in a given interconnect level.

Moreover, the relatively short silane processing can be tailored to achieve a given protection layer thickness, wherein it has been found that forming too much material may result in surface aberrations, whereby the planarity after CMP polishing is degraded, where layers of about 50 angstroms or less have been found to provide adequate corrosion protection without undue topology problems. Furthermore, thinner layers are more easily removed to expose the copper surfaces using the above-mentioned physical sputtering or other material removal processes prior to forming an overlying conductive structure. However, extremely thin protection layers may not be uniform enough to protect the copper surface during long exposures to corrosive ambient conditions, wherein thicknesses of about 10 angstroms or more have been found to provide adequate protection for extended metrology operations.

The silane treatments and resulting corrosion protection layers of the invention have been found to render the treated copper surfaces hydrophobic by lowering the $H_2O$ absorption when the wafers are exposed to high humidity environments that may be typical during metrology operations. In this regard, the silane treatment has been found to inhibit oxidation of the copper, wherein a 10 second silane treatment of the exposed copper was found to prevent formation of $Cu_2O$. Furthermore, a relatively small amount of silicon-copper binding (e.g., less than about 1%) was found for certain protection layers formed in the above mentioned conditions, wherein the amount of copper silicidation or copper-semiconductor alloy formation, if any, may be related to processing temperature and such silicidation is not critical to the invention. Moreover, the presence of the corrosion protection layer on the copper during etching of the etch-stop material (e.g., silicon nitride, silicon carbide, etc.) provides further protection of the copper surface, so as to inhibit etch-clean induced corrosion of the copper material, whereby an improved electrical contact may be achieved.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of protecting copper structures from corrosion in the fabrication of semiconductor devices, the method comprising:

providing a copper structure with an exposed first surface in a semiconductor device;

forming a conductive corrosion protection layer on the exposed first surface of the copper structure
in a plasma free silane gas treatment at a temperature of less than 350 degrees C. with about a 2% silane/nitrogen mixture to a thickness of less than 50 angstroms, the conductive corrosion protection layer comprising a semiconductor-copper alloy; and performing a metrology operation after forming the conductive corrosion protection layer and prior to forming addition layers over said conductive corrosion protection layer.

2. The method of claim 1, wherein providing the copper structure comprises:

forming copper over a previously formed dielectric layer, the copper filling an opening in the previously formed dielectric layer; and planarizing to expose portions of the previously formed dielectric layer and the first surface of the copper structure remaining in the opening.

3. The method of claim 1, wherein the conductive corrosion protection layer comprises copper silicide.

4. The method of claim 1, wherein the conductive corrosion protection layer comprises a copper silicide formed on the first surface of the copper structure and silicon formed on the copper silicide.

5. The method of claim 1, further comprising:

forming an etch-stop layer after performing the metrology operation.

6. The method of claim 5, wherein forming the etch-stop layer comprises forming silicon carbide or silicon nitride over the conductive corrosion protection layer after performing the metrology operation.

7. The method of claim 5, further comprising:

forming a dielectric over the etch-stop layer;

forming an opening by selectively removing portions of the dielectric, the etch-stop layer, and the conductive corrosion protection layer to expose at least a portion of the first surface of the copper structure; and forming a conductive structure in the opening.

8. The method of claim 7, wherein forming the conductive structure comprises:

forming at least one diffusion barrier in the opening; and filling the remainder of the opening with copper.

* * * * *